Aug. 26, 1969 A. S. GROVE ET AL 3,463,977

OPTIMIZED DOUBLE-RING SEMICONDUCTOR DEVICE

Filed April 21, 1966 2 Sheets-Sheet 1

INVENTORS.
ANDREW S. GROVE,
OTTO LEISTIKO,
RONALD J. WHITTIER,

BY [signature]

ATTORNEY

OPTIMIZED DOUBLE-RING SEMICONDUCTOR DEVICE

INVENTORS.
ANDREW S. GROVE,
OTTO LEISTIKO,
RONALD J. WHITTIER,

BY Roger S. Borovoy

ATTORNEY

United States Patent Office 3,463,977
Patented Aug. 26, 1969

3,463,977

OPTIMIZED DOUBLE-RING SEMICONDUCTOR DEVICE

Andrew S. Grove, Palo Alto, Calif., Otto Leistiko, Trorod, Denmark, and Ronald J. Whittier, Los Altos, Calif., assignors to Fairchild Camera and Instrument Corporation, Syosset, N.Y., a corporation of Delaware Filed Apr. 21, 1966, Ser. No. 544,229
Int. Cl. H01l 11/00, 15/00
U.S. Cl. 317—235 6 Claims

ABSTRACT OF THE DISCLOSURE

The metal contact to one region of a planar device containing a dish-shaped PN junction extending to one surface of the device, is extended across, but insulated from, the intersection of the PN junction with the surface. By selecting the correct insulation thickness, the breakdown voltage of the semiconductor PN junction is made equal to the breakdown voltage of the PN junction induced by the extended contact and thus the device breakdown voltage is maximized.

This invention relates to a semiconductor device wherein a junction is employed and an avalanche current occurs at a particular reverse bias voltage referred to as the breakdown voltage. In particular, this invention relates to double-ring diode or transistor structure such as described in U.S. patent application Ser. No. 506,750, filed Nov. 8, 1965, and assigned to the assignee of this invention wherein the breakdown voltage attainable is optimised by preventing the breakdown of a field-induced junction.

In the aforementioned patent application, a diode and transistor structure were described wherein, in addition to the usual structure, a contact layer was included. This layer was connected to one of the semiconductor regions and with a portion atop the protective material overlying the depletion region associated with a PN junction. Also, a charged-particle sink was included laterally exterior to the portion of the contact layer atop the protective material. This structure is herein referred to as a double-ring device. The double-ring structure increases the breakdown voltage while maintaining the stability of the device. However, it has now been discovered that this arrangement while advantageous does not permit optimum results unless certain parameters are controlled. Thus, this invention provides a double-ring structure wherein optimum results (e.g., breakdown voltages of 750 volts or greater) may be achieved.

Briefly, one embodiment of a device incorporating the invention comprises a first semiconductor region of a first conductivity type having a surface; a second semiconductor region of opposite conductivity type located adjacent said first region and forming a PN junction therewith that extends to said surface; a layer of protective material overlying at least a portion of said surface including said PN junction; and, a contact layer located adjacent said protective material overlying the depletion region associated with said PN junction, said layer of protective material having a thickness selected to improve the breakdown voltage of said device.

The invention will now be described with reference to the drawings, wherein:

FIG. 1 is a simplified cross-sectional view of a prior art semiconductor device;

FIG. 2*a* is a simplified cross-sectional view of one embodiment of the double-ring structure showing the depletion region prior to the formation of an inversion layer;

FIG. 2*b* is a simplified cross-sectional view of one embodiment of the double-ring structure showing the depletion region after the formation of the invention layer;

Figure 1:
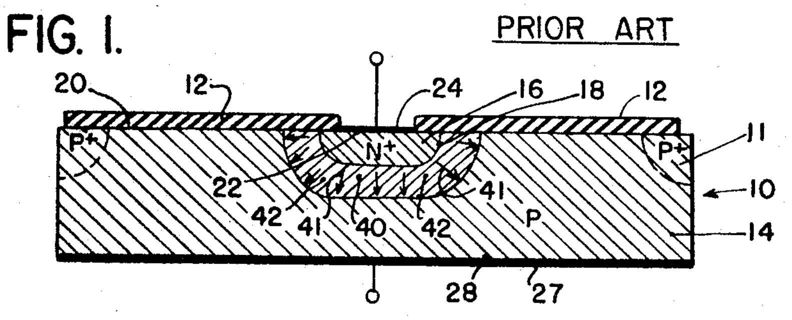
FIG. 1. PRIOR ART

Referring to FIG. 1, a prior art passivated-surface semiconductor device, such as semiconductor device 10 of monocrystalline silicon, is shown. The upper surface 20 of the device is covered with an insulating and protective layer 12 (e.g., oxide of silicon) that passivates the surface. The device has a first region 14 and a second region 16 located adjacent thereto and, in particular, nested within first region 14. The first region 14 has a first conductivity type which may be lightly doped p-type (e.g., p—), while the second region 16 has an opposite conductivity type which is then heavily doped n-type (e.g., n+). The regions 14 and 16 form a PN junction 18 which is island shaped and extends to substantially flat surface 20. In addition, a channel stop region 11 of the same conductivity type as the first region 14 but having higher doping concentration is formed such as to completely surround the PN junction 18. A contact layer 24 (e.g., Al) is electrically connected to second region 16 that has a portion 22 of its surface exposed by an opening in the insulating layer 12. A contact 27 is also electrically connected to first region 14. This contact may be attached to either surface 20 or surface 28. In this prior art device, when a reverse bias is applied to regions 14 and 16 via the contacts, a depletion region 40 is created with an electric field existing across the depletion region. The intensity of the electric field across depletion region 40 is particularly high in the vicinity of corners 42 and surface 20, thus resulting in a relatively low breakdown voltage of the device. This breakdown voltage in commercially available diffused planar devices is typically in the range of 30–200 volts.

Figure 2A:
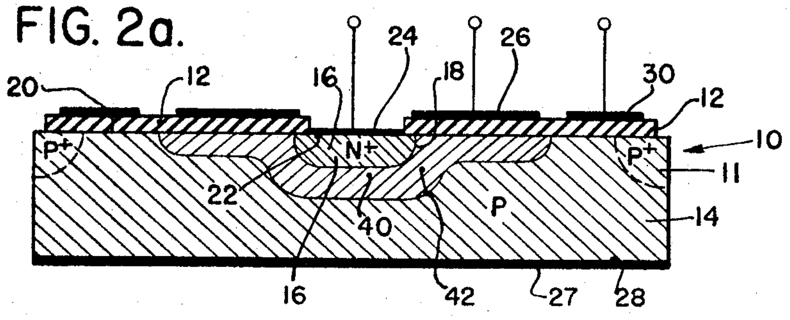
Figure 2B:
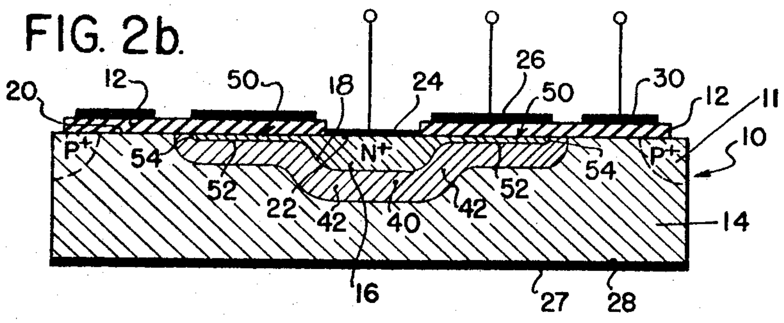

In order to overcome the low breakdown voltages encountered in prior art diffused planar devices, the double-ring structure was invented. This structure is described in detail in the above-referenced U.S. patent application. A semiconductor device 10 incorporating one embodiment of the double-ring structure is shown in FIGS. 2*a* and 2*b*, wherein structural elements that are similar to the ones shown in FIG. 1 bear the same numerical designation. Briefly, the double-ring structure includes first region 14, second region 16, insulating layer 12, surface 20 and contact 27, which are described above with reference to FIG. 1. This structure is changed by including a contact layer 24 that has an extended portion 26 which lies atop the insulating layer 12 and extends laterally beyond PN junction 18 to overlie depletion region 40 all around PN junction 18. It should be understood that extended portion 26 may be either continuous with the portion of the contact layer 24 that makes electrical contact with second region 16 or it may be discontinuous as shown in FIG. 2*a*. The contact layer 24 and its portion 26 are preferably in direct electrical connection either via the leads connected thereto or by portion 26 being a direct extension of the part of contact layer 24 that contacts second region 16. Portion 26 may be connected to a potential or a source different than the potential or source that is connected to the part of contact layer 24 that contacts region 16.

In addition to extended portion 26, a charged-particle sink 30 formed as a metal layer or film is added to the prior art structure shown in FIG. 1. Sink 30 (e.g., layer of Al) is adapted to collect charged particles present in or on top of insulating layer 12 and is located over insulating layer 12 laterally exterior to contact layer 24 and portion 26 and completely surrounds portion 26. Sink 30 is preferably attached to the heavily doped region 11 formed in first region 14. This may be accomplished by extending sink 30 to make direct electrical contact with region 11 via an opening in layer 12. Alternatively, sink 30 may be attached to a different potential or via a conductor not continuous with the layer forming sink 30 to a portion of region 14 not adjacent or in the vicinity of second region 16. Thus, extended portion 26 and sink 30 form a double-ring giving rise to the name double-ring structure which this type of structure is designated. The portion 26 and sink 30 may also be referred to as the inner and outer rings or gates, respectively.

The portion 26 and sink 30 have enabled higher breakdown voltages to be achieved while stability is at least maintained and in many instances is improved. This improvement in breakdown voltage characteristic is achieved by the application of a potential to portion 26 which alters the electric field associated with depletion region 40. The electric field associated with the depletion region is altered in such a manner that a lower intensity field exists in the vicinity of corner 42 and near surface 20 than normally existed in planar diffused devices.

Figure 3:
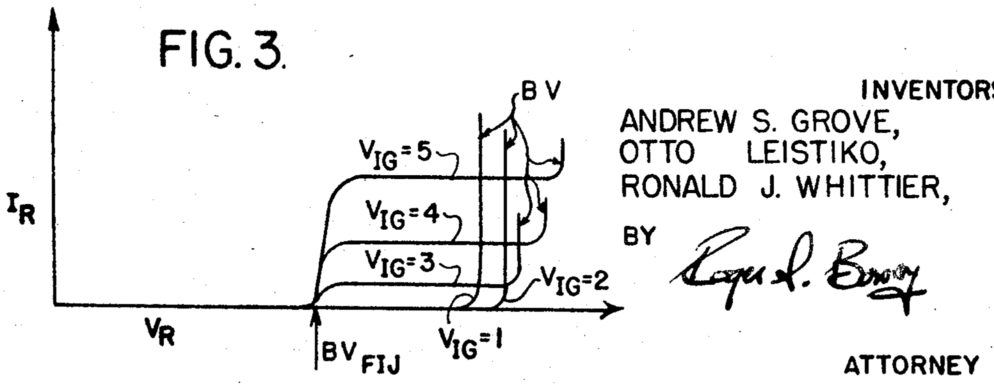
FIG. 3 is a graph of reverse biased diode current versus reverse bias voltage for various voltages applied to portion 26 of the contact layer.
Figures 4, 5, 6:
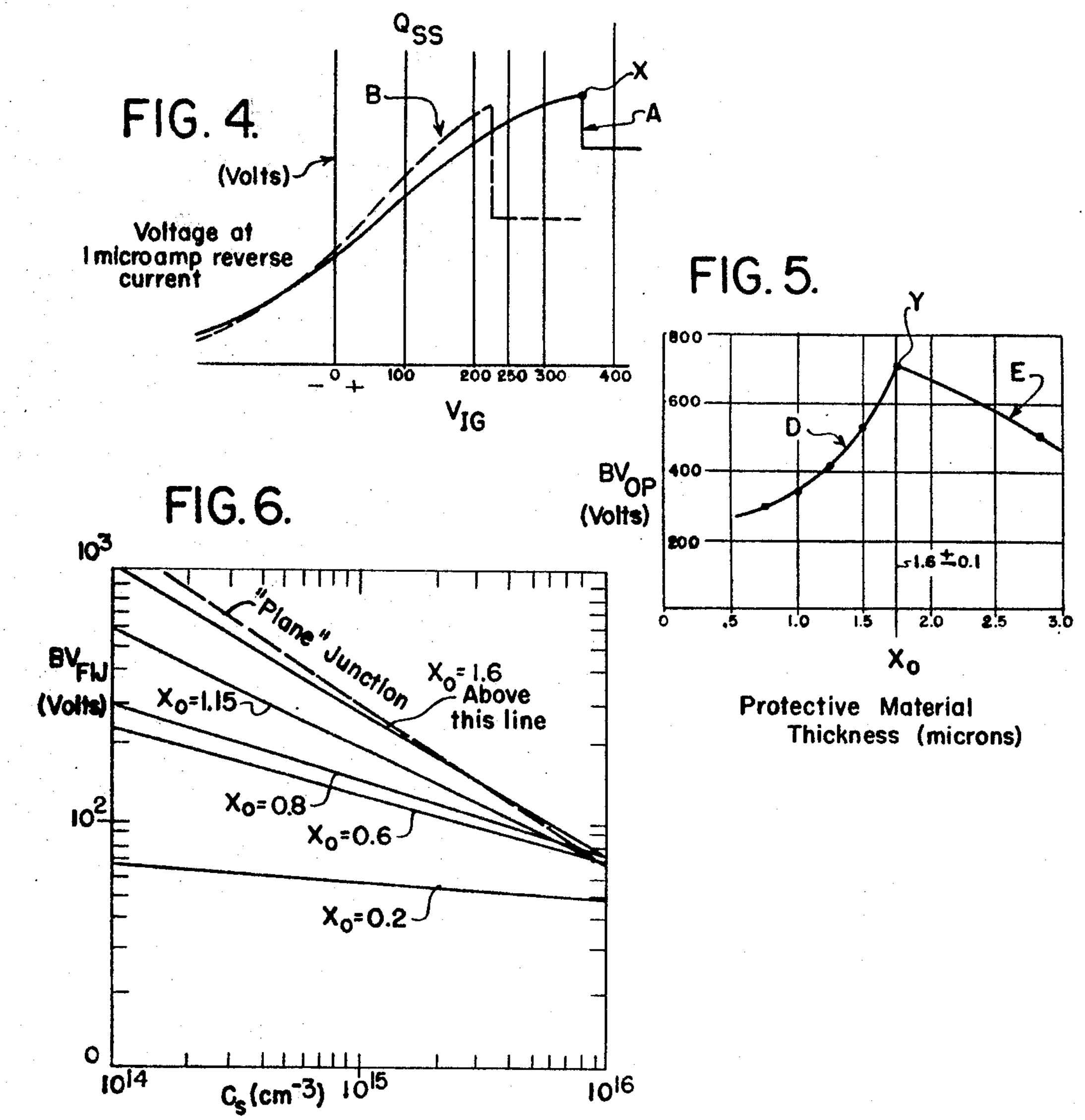
FIG. 4 is a graph of the breakdown voltage, BV, versus the voltage, $V_{IG}$, applied to the portion 26 of the contact layer.
FIG. 5 is a graph of operational breakdown voltage, $BV_{OP}$, versus protective material thickness.
FIG. 6 is a graph of the breakdown voltage of the field-induced junction, $BV_{FIJ}$, versus surface concentration for devices having different protective material thicknesses; and, FIG. 7 is a graph of $BV_{FIJ}$ versus protective material thickness for devices with various surface concentrations.

In exploring the limits of breakdown voltage that may be obtained with the double-ring structure, it has been discovered that when a voltage equal to or larger than a particular voltage, $V_T$, is applied to portion 26, an inversion layer 50 (shown in FIG. 2*b*) is created in first region 14 beneath portion 26 and extending outwardly from junction 18. The inversion layer 50 has a conductivity type the same as second region 16, thereby forming in effect an extension of this region. The inversion layer 50 forms a field-induced junction 52 substantially continuous with junction 18, which like junction 18 has a depletion region and electric field associated therewith. At the corner 54 of field-induced junction 52 and near the surface 20, the electric field is at a high intensity, whereby breakdown of the field-induced junction occurs. This breakdown of the field-induced junction may occur at a voltage substantially lower than the breakdown voltage of junction 18. This phenomenon is illustrated by the graphs of FIGS. 3 and 4. The symbol BV herein employed refers to the breakdown voltage of the fabricated junction, while the symbol $BV_{FIJ}$ refers to the breakdown voltage of the field-induced junction.

FIG. 3 shows a current-versus-voltage graph with each curve representative of a different voltage, $V_{IG}$, applied to portion 26. As the voltage, $V_{IG}$, applied to the portion 26 is increased ($V_{IG}=1$ and $V_{IG}=2$, etc.) the breakdown voltage is also increased. This corresponds to the formation of a depletion region under portion 26 which is shaped by portion 26 to reduce the fields in the vicinity of the corner of the junction and near surface 20. However, when the voltage, $V_{IG}$, applied to portion 26 is large enough (e.g., $V_{IG}=3$), an inversion layer 50 is formed and biased to a potential which exceeds the breakdown voltage of the field-induced junction, $BV_{FIJ}$. As a result, an avalanche current will start flowing between the end of inversion layer 50 and region 14. This avalanche current must go through the series resistance of the inversion layer 50, thereby giving rise to a saturated current-voltage characteristic as indicated in FIG. 3. The breakdown voltage BV occurs at a higher voltage $V_R$. This effect is summarized in the graph of FIG. 4, wherein curve A shows that as the voltage, $V_{IG}$, applied to portion 26 is increased, the voltage at which the reverse current exceeds some low value, e.g., 1 microamp, will increase to a point X, at which point this voltage experiences a sharp decline caused by the breakdown of the field-induced junction.

It has been found that the creation of an inversion layer in a semiconductor material occurs at a particular voltage, $V_T$, applied to portion 26. The magnitude of $V_T$ depends on the reverse bias applied to the junction 18. In particular, when the reverse bias is large enough that breakdown of the field-induced junction can take place, i.e., equal to $BV_{FIJ}$, the value of this voltage is given by the Equation 1:

$$V_T=-\frac{Q_{ss}}{K_0\epsilon_0}x_0+BV_{FIJ}+2\phi_F\pm\frac{x_0}{K_0\epsilon_0}\sqrt{2K_s\epsilon_0 q(N_A-N_D)(BV_{FIJ}+2\phi_F)}$$

wherein:

$Q_{ss}$=Effective surface-state charge density
$K_0$=dielectric constant of protective insulating material
$\epsilon_0$=permittivity of free space, $8.85\times10^{-14}$ fd/cm.
$x_0$=thickness of the protective insulating material
$K_s$=dielectric constant of the semiconductor
$q$=unit of electron charge, $1.6021\times10^{-19}$ coulombs
$N_A-N_D$=substrate net impurity concentration
$BV_{FIJ}$=breakdown voltage of the field-induced junction
$\phi_F$=potential of the Fermi level of the substrate majority carrier measured from the intrinsic Fermi level in the substrate.

All applied voltages are referred to the potential of the substrate. The positive sign is taken for an n+p diode, the negative sign for a p+n diode. In the rest of this discussion, we restrict ourselves to the n+p case, unless otherwise indicated. The discussion, however, is equally valid for the p+n case with proper changes in polarities.

The creation of the inversion layer 50 in itself is not a problem. It is the creation of the inversion layer 50 coupled with the application of a reverse bias large enough that the breakdown of the field-induced junction can take place, i.e., equal to $BV_{FIJ}$, that results in premature breakdown. Thus, in order to optimize the operation of the double-ring structure and solve this problem, the voltage $V_T$ should be of such value that the potential applied to portion 26 will not exceed this value, since in that case a field-induced junction biased to a potential greater than $BV_{FIJ}$ cannot exist. It has been found that the value of $V_T$ may be increased by controlling the thickness $x_0$ of protective material 12, by controlling the value of the surface-state charge density, $Q_{SS}$, or by controlling the value of the breakdown voltage of the field-induced junction, $BV_{FIJ}$. According to this invention, it is preferred that the thickness of protective material 12 be increased to increase the value of $V_T$. However, it is within the broad scope of the invention to control any one or all of these variables ($Q_{SS}$, $BV_{FIJ}$ and $x_0$) to achieve a desired value of the voltage $V_T$. The other parameters of Equation 1 depend on the materials selected for a particular device.

It is preferred that the value of voltage, $V_T$, be increased by varying the thickness of protective material 12 because the thickness of the protective material may readily be varied, measured and precisely controlled by present techniques. In addition, the variations in the thickness of protective material 12 have a substantial effect on $V_T$ because an increase in this thickness also brings about an increase in $BV_{FIJ}$ (as will be discussed later), thereby resulting in a greater effect on $V_T$ than explicitly indicated by Equation 1.

The only drawback with varying the thickness of the protective material to vary the value of the voltage, $V_T$, is that too large an increase in thickness will result in removing the portion 26 too far from the surface 20 and thereby decrease its influence on the junction breakdown voltage. This is illustrated in FIG. 5, wherein the device tested had portion 26 connected to contact 24. It is shown in FIG. 5 that the breakdown voltage (which may specifically be referred to as operational breakdown voltage, $BV_{OP}$) attainable is increased along curve D as the thickness of the protective material is increased until optimum point Y is reached. At this point further increase of the thickness of the protective material will result in a decrease of the breakdown voltage of the particular device in accordance with curve E. It seems that after the optimum point the breakdown of the field-induced junction 52 will no longer present a problem, but that after this point the effectiveness of the field resulting from the potential applied to portion 26 will diminish and breakdown will occur at the corner of junction 18 near 42. Thus, along curve E breakdown is due primarily to semiconductor junction 18, while along curve D breakdown voltage is due primarily to the field-induced junction 52. From a study of FIG. 5, it can be seen that the slope of curve E is much less than that of curve D. Thus, devices having a protective material thickness which falls along curve E permit greater thickness tolerance. Generally, if protective material 12 is silicon dioxide, it should have a thickness in excess of approximately 1.25 microns and, more specifically, between approximately 1.20–2.5 microns. For many devices the optimum point has been 1.6+0.1 microns. The minimum thickness of the protective material for a particular value of voltage $V_T$ may be determined from the Equation 2:

$$x_{0\,\text{min.}} = \pm K_0\epsilon_0 \frac{V_T - BV_{FIJ} - 2\phi_F}{\sqrt{2K_s\epsilon_0 q(N_A - N_D)(BV_{FIJ}+2\phi_F)} - Q_{ss}}$$

wherein: $x_{0\text{min}}$ is the minimum thickness of the protective material for which breakdown of the field-induced junction is prevented, and all other symbols and sign convention are as given following Equation 1.

In summary, the layer of protective material 12 should have a thickness that enables the breakdown voltage to be increased by increasing the potential applied to portion 26, but not subsentially in excess of the thickness existing at the optimum point for the particle device. Alternatively, the thickness of the protective material 12 should be such that the breakdown voltage of the device is attributable to the breakdown of the semiconductor junction rather than the field-induced junction.

The effect of increasing the thickness of the protective material can be further understood by reference to FIG. 4, wherein curve A represents a device having a first protective material thickness and curve B represents a device having a thinner protective material. At a first potenial applied to portion 26, such as 100 volts, the device of curve B with its thinner protective material thickness displays a slightly greater breakdown voltage. However, with 250 volts applied to portion 26, the device of curve A having a greater oxide thickness displays the higher breakdown voltage. Thus, increasing the oxide thickness may lower the breakdown voltage attainable with lower potentials applied to portion 26, while increasing the maximum breakdown voltage attainable. The breakdown voltage with the lower potentials applied to portion 26 is not particularly important, since in the preferred embodiment of the invention, the voltage applied across junction 18 and voltage applied to portion 26 are substantially the same because of the interconnection between the portions of contact layer 24. Thus, a large voltage $V_{IG}$ will be applied to portion 26 when a large breakdown voltage is required.

The breakdown voltage attainable may also be increased by increasing the value of the breakdown voltage of the field-induced junction, $BV_{FIJ}$. The value of the breakdown voltage, $BV_{FIJ}$, is largely determined by the surface concentration $C_S$ of the impurity, the thickness of protective material 12, and the field existing between the particle sink 30 and the inversion layer 50. With regard to the latter factor, it is preferred that sink 30 is maintained at approximately the same potential as region 14 by directly connecting sink 30 thereto. Consequently, the field between inversion layer 50 and sink 30 is usually fixed. In some instances, it may be desirable to increase the breakdown voltage $BV_{FIJ}$ by altering the field between inversion layer 50 and sink 30 by connecting sink 30 to a different potential. Thus, by connecting sink 30 to some external source of voltage of the same polarity as that applied to contact layer 24, the electric field at the end of the field-induced junction 54 will be reduced whereby the breakdown voltage $BV_{FIJ}$ is increased.

Figure 7:
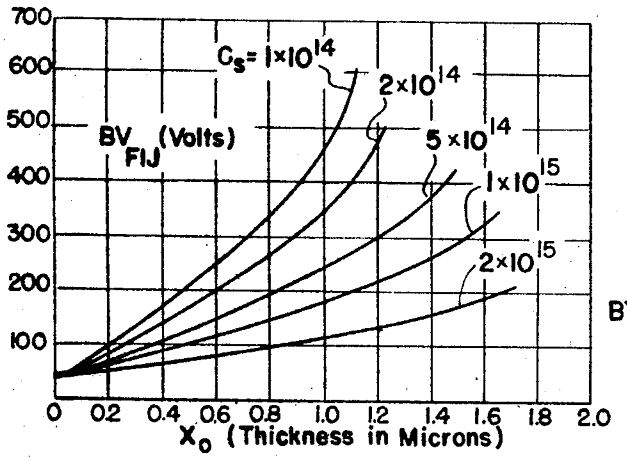

The manner in which the breakdown voltage of the field-induced junction $BV_{FIJ}$ varies with the surface concentration of the dopant or impurity is shown in FIG. 6 wherein the various curves are for devices having different protective material thicknesses. In general, the highest value of the breakdown voltage of the field-induced junction is attained at the lowest surface concentrations and the largest protective material thickness. This is clearly shown in FIG. 7 wherein the field-induced junction breakdown voltage $BV_{FIJ}$ is plotted as a function of protective material thickness for devices with various surface concentrations. It can be seen that a device with a surface concentration in the vicinity of $10^{14}$ atoms/cm.$^3$ and a protective material thickness of 1.5 microns has an extremely high $BV_{FIJ}$. It can be seen from FIG. 7 that essentially the same value for $BV_{FIJ}$ may be obtained at higher surface concentrations by increasing the thickness of the protective material. The only limitation on controlling $BV_{FIJ}$ by increasing the protective material thickness is the effect that increasing the protective material has on the effectiveness of the potential applied to portion 26 as depicted in FIG. 5. In any event, it is preferred that the breakdown voltage of the field-induced junction, $BV_{FIJ}$, be controlled primarily by altering the oxide thickness and, secondly, by controlling the surface concentration and maintaining this concentration as low as possible cosistent with other processing and device requirements.

In summary, to maximize the breakdown voltage attainable by the double-ring structure, the value of the voltage $V_T$ at which an inversion layer 50 capable of breaking down is formed, should be increased and made as large as possible consistent with maintaining the effectiveness of portion 26 and the other device requirements. The value of the voltage $V_T$ may be most readily increased by increasing the thickness of the protective material. When the polarity of the surface state charge density, $Q_{SS}$, is proper, an increase in the protective material thickness will increase every term in Equation 1 with the exception of the term $2\phi_F$. The oxide thickness should not be increased much beyond the optimum point nor should it be substantially less than the value at the optimum point in order to achieve maximum breakdown voltage. In tests it has been shown that by increasing the protective material thickness from 0.75 micron to 1.75 microns, the breakdown voltage of devices using the double-ring structure may be increased from 350 volts to 720 volts.

Although this invention has been disclosed and illustrated with reference to a particular embodiment, the principles involved are susceptible of numerous other embodiments which will be apparent to persons skilled in the art. The invention is, therefore, to be limited only as indicated by the scope of the appended claims.

What is claimed is:

1. A semiconductor device comprising:

a first semiconductor region of a first conductivity type having at least one surface;

a second semiconductor region of opposite conductivity type formed within said first semiconductor region and forming with said first semiconductor region a dish-shaped PN junction extending to a selected surface;

a layer of insulating material overlying at least a portion of said selected surface including the intersection of said PN junction with said surface;

metal contacts attached to said first and said second semiconductor regions for selectively biasing said PN junction; and a contact layer overlying and adherent to said layer of insulating material, said contact layer overlying the intersection of said PN junction with said selected surface and extending on said insulating material over a portion of said first semiconductor region, such that when a selected voltage is applied to said contact layer, the portion of said first semiconductor region beneath said first contact layer inverts from said first conductivity type to said opposite conductivity type;

wherein said layer of insulating material has a thickness $X_0$ given by the equation $$X_0 = \left| K_0 \epsilon_0 \left[ \frac{V_T - BV_{FIJ} - 2\phi_F}{\sqrt{2K_S \epsilon_0 q (N_A - N_D)(BV_{FIJ} + 2\phi_F)} - Q_{SS}} \right] \right|$$

wherein $K_0$ is the dielectric constant of the insulating material, $e_0$ is the permittivity of free space, $BV_{FIJ}$ is the breakdown voltage of the field-induced junction, $\phi_F$ is the difference between the Fermi level of the underlying semiconductor material and the intrinsic Fermi level of this material, $q$ is the electronic charge on an electron, $N_A$ is the concentration of acceptor impurities in the underlying semiconductor material, $N_D$ is the concentration of donor impurities in the underlying semiconductor material, $Q_{SS}$ is the surface charge per unit area in the layer of insulating material and $V_T$ is the voltage which, when applied to the contact layer overlying said layer of insulating material inverts a selected part of said first semiconductor region beneath said contact layer from a first conductivity type to said opposite conductivity type.

2. The device in claim 1, including a charged particle sink for collecting charged particles present in and on the surface of said insulating material, said sink being attached to the surface of said insulating material above said first semiconductor region.

3. The device recited in claim 1, wherein the thickness of said layer of dielectric material is no greater than 2.5 microns.

4. The device recited in claim 1, wherein said first and second semiconductor regions are composed of selectively doped silicon and said layer of insulating material consists of a layer of silicon dioxide.

5. The device as recited in claim 1 wherein said contact layer is an extension of, and at the same potential as, the metal contact attached to said second region of semiconductor material.

6. The process of maximizing the breakdown voltage of a semiconductor device consisting of a first semiconductor region of a first conductivity type having at least one surface, and a second semiconductor region of opposite conductivity type formed within said first semiconductor region and forming with said first semiconductor region a dish-shaped PN junction extending to a selected surface, consisting of the steps of:

forming a layer of insulating material overlying at least that portion of said selected surface including the intersection of said PN junction with said surface, said layer of insulating material being formed to have a thickness substantially equal to $X_0$ where $X_0$ is given by the equation $$X_0 = \left| K_0 \epsilon_0 \left[ \frac{V_T - BV_{FIJ} - 2\phi_F}{\sqrt{2K_S \epsilon_0 q (N_A - N_D)(BV_{FIJ} + 2\phi_F)} - Q_{SS}} \right] \right|$$

where $K_0$ is the dielectric constant of the insulating material, $\epsilon_0$ is the permitivity of free space, $BV_{FIJ}$ is the breakdown voltage of the field induced junction, $\phi_F$ is the difference between the Fermi level of the underlying semiconductor material and the intrinsic Fermi level of this material, $q$ is the electronic charge on the electron, $N_A$ is the concentration of acceptor impurities in the underlying semiconductor material, $N_D$ is the concentration of donor impurities in the underlying semiconductor material, $Q_{SS}$ is the surface charge per unit area in the layer of insulating material and $V_T$ is the voltage which when applied to a contact layer overlying said layer of insulating material inverts a selected part of said semiconductor region beneath said contact layer from a first conductivity type to said opposite conductivity type;

attaching metal contacts to said first and said second semiconductor regions of semiconductor material for selectively backbiasing said PN junction;

placing a metal contact layer overlying and adherent to said layer of insulating material, said contact layer overlying the intersection of said PN junction with said selected surface and extending on said insulating layer over a portion of said first semiconductor region; and applying a selected voltage to said contact layer, such that the portion of said first semiconductor region beneath the first contact layer inverts from said first conductivity type to said opposite conductivity type and such that the breakdown voltage of the field induced junction between said inverted region and said first semiconductor region is approximately the same as the breakdown voltage across said dish-shaped PN junction extending to said selective surface, thereby maximizing the breakdown voltage of said device.

References Cited

UNITED STATES PATENTS

| | | | |
|---|---|---|---|
| 3,204,160 | 8/1965 | Sah | 317—235 |
| 3,302,076 | 1/1967 | Kang et al. | 317—234 |
| 3,303,059 | 2/1967 | Kerr et al. | 148—1.5 |
| 3,391,287 | 7/1968 | Kao | 317—235 X |

FOREIGN PATENTS

| | | |
|---|---|---|
| 998,388 | 7/1965 | Great Britain. |
| 1,400,150 | 4/1965 | France. |
| 6,413,894 | 8/1965 | Netherlands. |

OTHER REFERENCES

Extract from Texas Instruments Booklet—New Products Review for Wescon, 1964.

Electronic News, May 31, 1965.

Electrode Control of $SIO_2$—Passivated Planar Junctions, by Castrucci and Logan, reprinted by IBM Journal of Research and Development, vol. 8, No. 4, September 1964.

JAMES D. KALLAM, Primary Examiner

R. F. POLISSACK, Assistant Examiner

U.S. Cl. X.R.

29—589, 590, 591